(12) United States Patent
Choo

(10) Patent No.: US 7,324,155 B2
(45) Date of Patent: Jan. 29, 2008

(54) CAMERA CASE STRUCTURE FOR A MOBILE COMMUNICATION DEVICE

(75) Inventor: Zhi Min Choo, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 757 days.

(21) Appl. No.: 10/746,457

(22) Filed: Dec. 23, 2003

(65) Prior Publication Data

US 2004/0135920 A1 Jul. 15, 2004

(30) Foreign Application Priority Data

Dec. 30, 2002 (KR) .................. 10-2002-0087167

(51) Int. Cl.
*H04N 5/225* (2006.01)
*H01L 23/34* (2006.01)
*H04M 1/00* (2006.01)

(52) U.S. Cl. .................. 348/374; 455/575.1; 257/727

(58) Field of Classification Search .......... 348/374, 348/376; 455/575.1, 575.3, 575.4, 575.8, 455/556.1; 257/732, 727, 730, 731

See application file for complete search history.

(56) References Cited

U.S. PATENT DOCUMENTS

| | | | | |
|---|---|---|---|---|
| 5,783,815 A | * | 7/1998 | Ikeda | 250/208.1 |
| 5,903,306 A | * | 5/1999 | Heckendorn et al. | 348/85 |
| 6,787,884 B2 | * | 9/2004 | Hirano et al. | 257/730 |
| 7,239,899 B2 | * | 7/2007 | Lin | 455/575.1 |
| 2002/0061676 A1 | * | 5/2002 | Kameyama et al. | 439/404 |
| 2002/0126457 A1 | * | 9/2002 | Kameyama | 361/728 |
| 2002/0187818 A1 | * | 12/2002 | Kang | 455/575 |
| 2004/0017501 A1 | * | 1/2004 | Asaga et al. | 348/340 |
| 2004/0157652 A1 | * | 8/2004 | Yamazaki | 455/575.3 |

* cited by examiner

*Primary Examiner*—Lin Ye
*Assistant Examiner*—Jason Whipkey
(74) *Attorney, Agent, or Firm*—Lee, Hong, Degerman, Kang & Schmadeka

(57) ABSTRACT

A support structure for reducing shock to a camera module for use in a mobile communications terminal is provided. The mobile communication terminal comprises a camera case for housing the camera module, the support structure comprising a first projection protruding from an inner surface of the camera case, the first projection in operational relationship with a first receiving cavity formed in the camera module to firmly hold the camera module inside the camera case and prevent the camera module from moving in relationship to the camera case.

8 Claims, 5 Drawing Sheets

PRIOR ART

*PRIOR ART*

CAMERA CASE STRUCTURE FOR A MOBILE COMMUNICATION DEVICE

CROSS-REFERENCE TO RELATED APPLICATIONS

Pursuant to 35 U.S.C. § 119(a), this application claims the benefit of earlier filing date and right of priority to the Korean Application No. 2002-87167, filed on Dec. 30, 2002, entitled "Camera Case Structure of Mobile Phone" the content of which is hereby incorporated by reference herein in its entirety.

BACKGROUND OF THE INVENTION

1. Field of the Invention

The present invention relates to a camera case structure of a mobile phone, and more particularly, to a structure for supporting a camera module in a camera case of a mobile phone, to prevent damage to a printed circuit board in a lower portion of the camera module.

2. Description of the Related Art

A related art structure for supporting a camera module in a camera case of a mobile phone is shown in FIG. 1. A camera module 20 is inserted into a cylindrical camera case 10 and the lower end portion thereof is supported by a rubber pad 30. A lens of a lens assembly 24 of the camera module 20 is arranged to face a lens window 12 formed in the camera case 10.

The rubber pad 30 has a flat shape on the side facing the camera module to fill a space between the camera module 20 and the camera case 10. The center portion and the circumferential portion of the rubber pad 30 are different from each other in thickness, because the side facing the case is cylindrical in shape.

In the above structure, when a user drops his mobile phone by mistake, the center portion of the rubber pad 30 is deformed upwardly damaging the printed circuit board 22, as shown in FIG. 2. This is because the thickness of the rubber pad 30 is not uniform in the vertical direction. That is, a force F1 acts on both side portions of the printed circuit board 22 in one direction, but a force F2 acts on the center portion thereof in the opposition direction. A method or structure is needed to overcome the above disadvantages.

SUMMARY OF THE INVENTION

A support structure for reducing shock to a camera module for use in a mobile communications terminal is provided. The mobile communication terminal comprises a camera case for housing the camera module, the support structure comprising a first projection protruding from an inner surface of the camera case, the first projection in operational relationship with a first receiving cavity formed in the camera module to firmly hold the camera module inside the camera case and prevent the camera module from moving in relationship to the camera case.

The support structure further comprises a second projection protruding from the inner surface of the camera case, the second projection in operational relationship with a second receiving cavity formed in the camera module to firmly hold the camera module inside the camera case and prevent the camera module from moving in relationship to the camera case.

In some embodiments, the camera module comprises a lens positioned proximate to the first receiving cavity and a printed circuit board positioned proximate to the second receiving cavity. The first projection engages the first receiving cavity in an upper portion of the camera module. The second projection engages the second receiving cavity in a lower portion of the camera module.

In accordance to another embodiment, a camera case for receiving outer surface of a camera module having an upper portion and a lower portion, the cameral case comprising first inward projections for firmly engaging concaved areas of the upper portion of the camera module to prevent sensitive areas of the camera module from shock, and second inward projections for firmly engaging indented areas of the lower portion of the camera module to prevent sensitive areas of the camera module from shock. The sensitive areas of the camera comprise a printed circuit board. A lens is constructed in proximity of the upper portion and a printed circuit board is constructed in proximity to the lower portion of the camera module.

BRIEF DESCRIPTION OF THE DRAWINGS

The above and other objects, advantages and features of the present invention will be apparent from the following description of preferred embodiments given in conjunction with the accompanying drawings, in which.

DETAILED DESCRIPTION OF THE INVENTION

Figure 1:
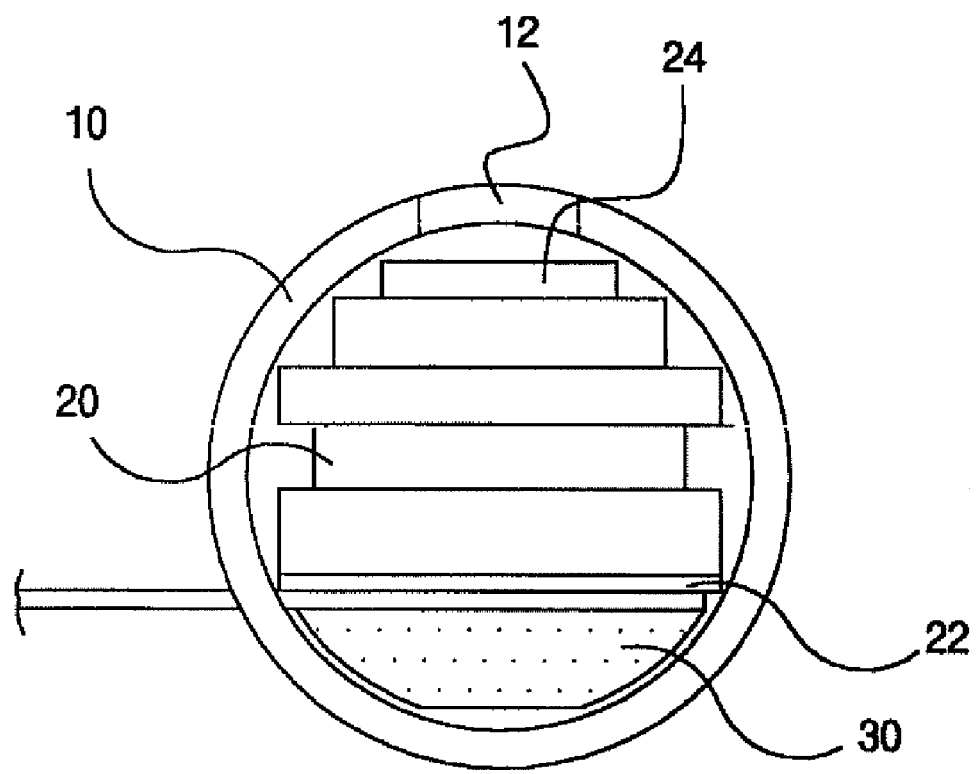
FIG. 1 is a cross-sectional side view of a camera module for a mobile communication device.
Figure 2:
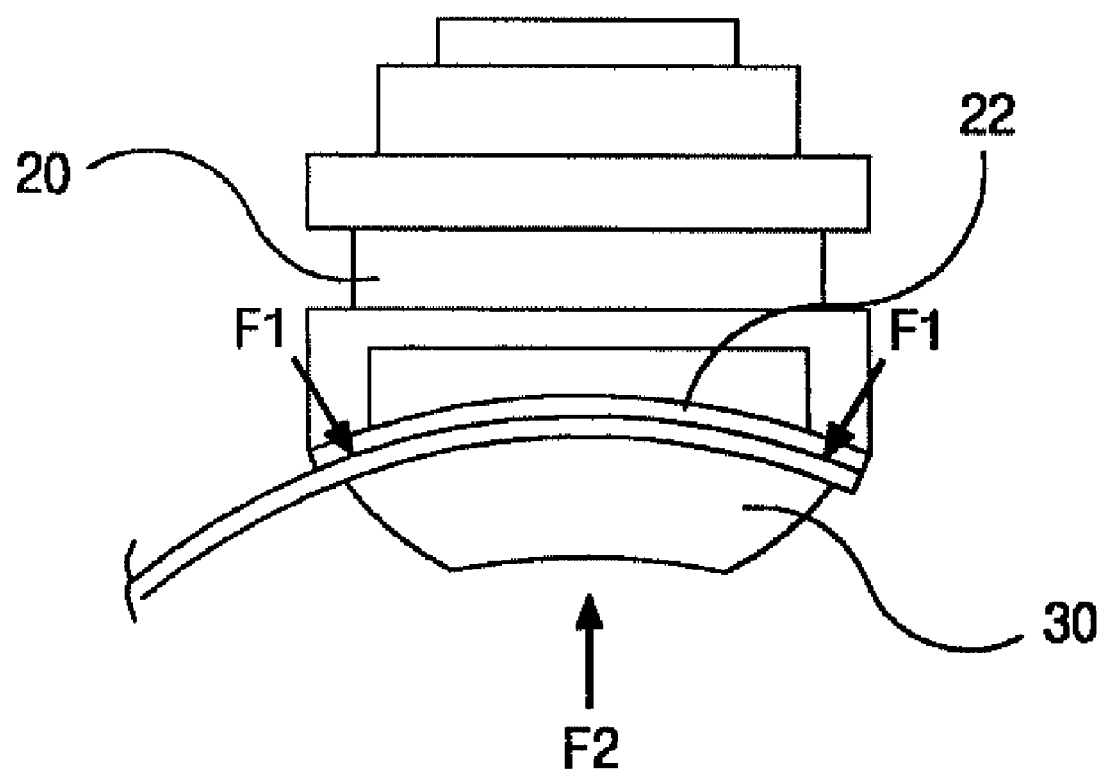
FIG. 2 is the camera module of FIG. 1 with deformation generated due to forces acting on the printed circuit board.
Figure 3:
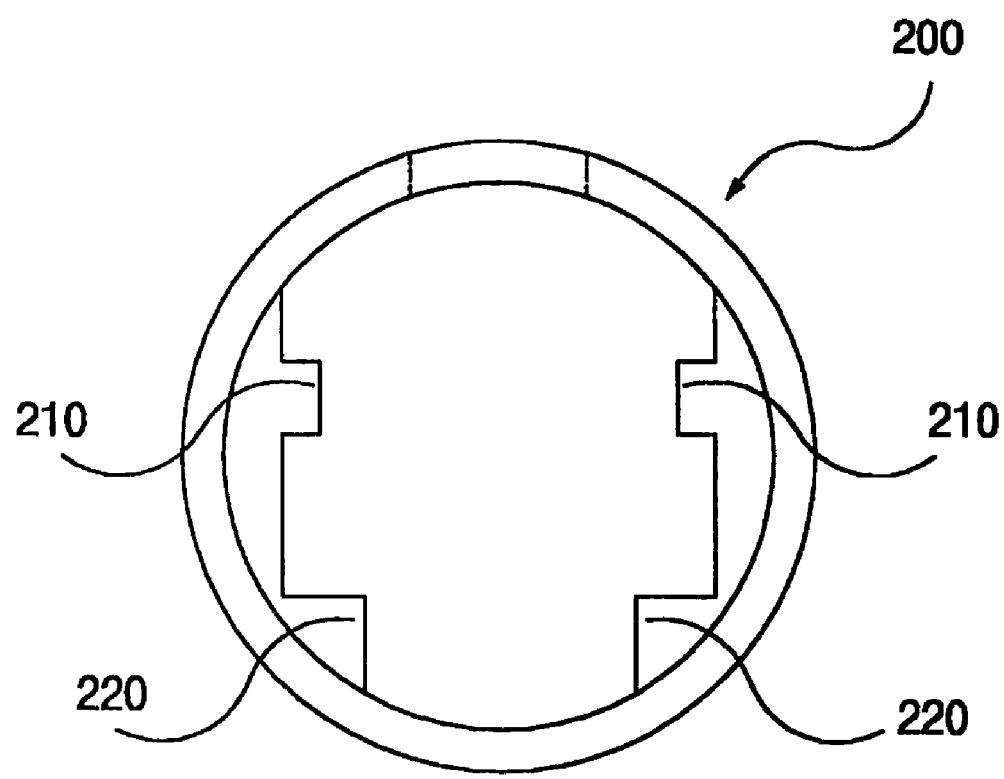
FIG. 3 is a cross-sectional side view of an embodiment of the camera case of the invention.
Figure 4:
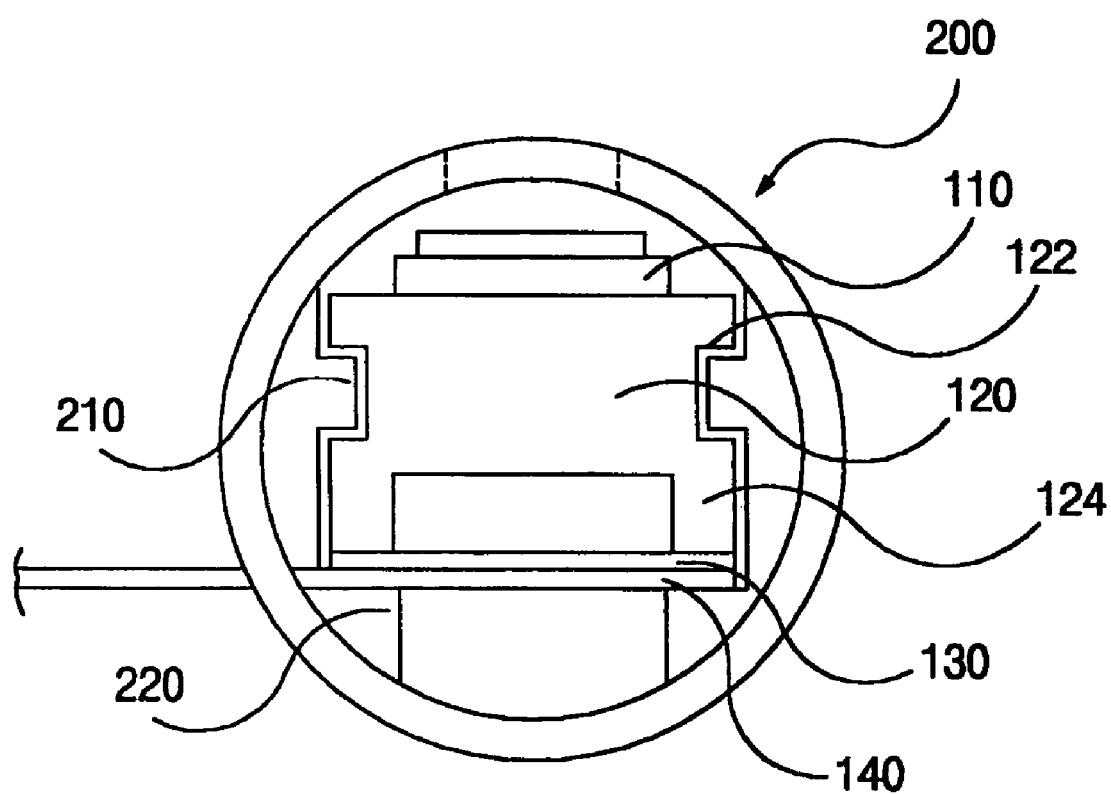
FIG. 4 is a cross-sectional side view of an embodiment of the invention in a state that a camera module has been provided in the camera case.

Referring to FIGS. 3 and 4, a camera module in accordance with one or more embodiments comprises a lens assembly 110, a camera module body 120, a printed circuit board 130 and a soft printed circuit board 140. The lens assembly 110 is provided in the upper end portion of the camera module 120. In the upper portion of the camera module body 120, concave portions 122 are formed and in the lower portion of the camera module body 120, a lead frame 124 is formed. The printed circuit board 130 with an image pickup device (not shown) is coupled to the lower portion of the lead frame 124. The soft printed circuit board 140 is preferably attached to the printed circuit board 130 and is connected to a main printed circuit board (not shown) of a main body of a mobile communication device.

One embodiment of the present invention has movement preventing projections 210 and printed-circuit-board supporting projections 220. The movement preventing projections 210 are formed to be projected from the upper-right and upper-left sides of the camera case 200. The movement preventing projections 210 are formed to support the concave portions 122 on the right and left sides of the camera module. The printed-circuit-board supporting projections 220 are formed to be projected from the lower-right and lower-left sides of the camera case 200. The printed-circuit-board supporting projections 220 are formed to support the right and left portions of the printed circuit board 130 attached to the lower end portion of the camera module, in one or more embodiments.

Figure 5:
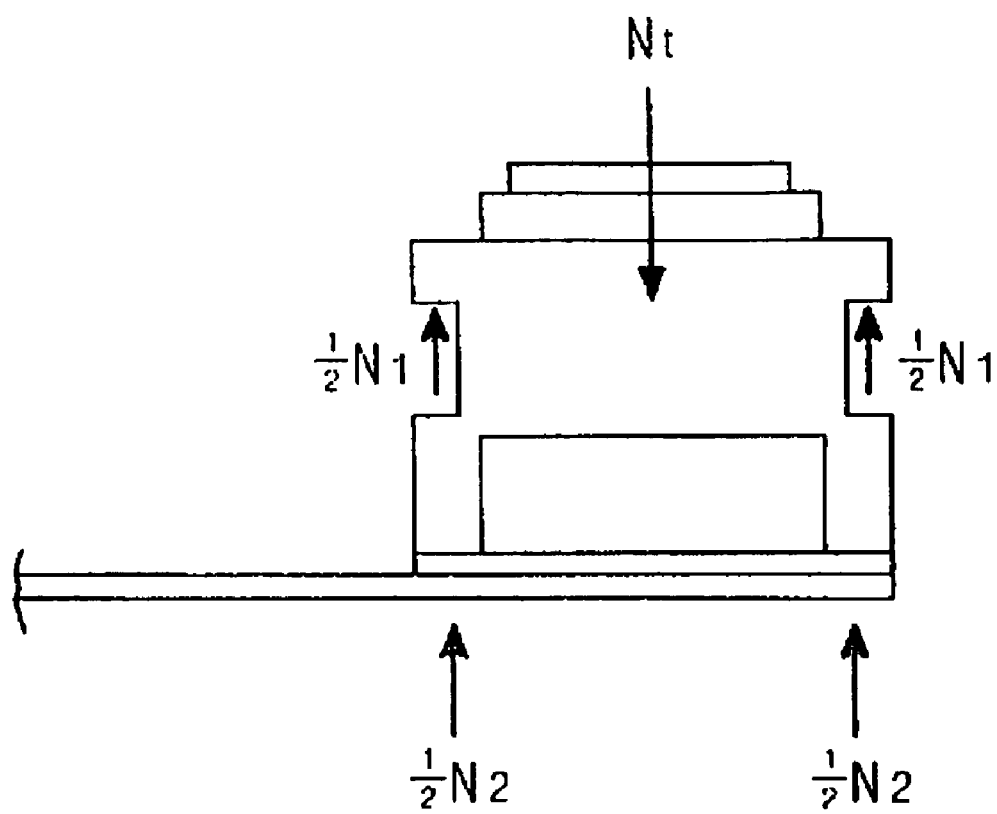
FIG. 5 is a cross-sectional side view of the invention illustrating distribution of forces acting on the camera module, when a shock force acts on one embodiment of the invention.

Referring to FIG. 5, when the shock force $N_t$ acts due to the dropping of the mobile phone, as shown in FIG. 5, $N_1$ and $N_2$ are applied to the movement preventing projections 210 and the printed-circuit-board supporting projections 220, respectively. Therefore, since $N_2$ acts on the printed circuit board 130, only a part of the entire shock force acts upon the circuit board 130, as N1 is already absorbed.

In the present embodiment, since there exists no structure for supporting the center portion of the printed circuit board 130, no force is applied directly to the center portion of the printed circuit board 130.

Although the printed-circuit-board supporting projections 220 are described in the present embodiment, in some embodiments the movement preventing projections 210 may be provided without the printed-circuit-board supporting projections 220 being present.

Accordingly, the movement preventing projections 220 absorb a shock force due to the dropping of the mobile phone and thus only a part of the shock force acts on the printed circuit board.

Also, the printed-circuit-board supporting projections 220 formed to be projected from the right and left sides of the camera case, support the right and left portions of the printed circuit board of the camera module. Thus, the shock force is decentralized preventing deformational in the center portion of the printed circuit board.

What is claimed is:

1. A camera support structure for a camera module for use in a mobile phone, the camera support structure comprising:
    a first projection protruding from a first inner surface of a cylindrical camera case;
    an engaging portion formed on a side surface of the camera module, wherein the first projection is configured to engage the engaging portion to provide a lateral support to the camera module; and
    a second projection protruding from a second inner surface of the camera case to support a lower end portion of the camera module to limit axial movement of the camera module, wherein an area of the lower end portion supported by the second projection is smaller than an entire area of the lower end portion.

2. The camera support structure of claim 1, wherein the first inner surface comprises a side wall and the second inner surface comprises a lower wall of the cylindrical camera surface.

3. The camera support structure of claim 1, wherein the lower end portion of the camera module comprises a printed circuit board.

4. The camera support structure of claim 1, wherein the second projection is disposed to provide support for an area proximate to at least one outer edge of the camera module.

5. A camera assembly comprising a camera module for use in a mobile phone and a support structure for the camera module, the camera support structure comprising:
    a first projection protruding from a first inner surface of a cylindrical camera case;
    an engaging portion formed on a side surface of the camera module, wherein the first projection is configured to engage the engaging portion to provide a lateral support to the camera module; and
    a second projection protruding from a second inner surface of the camera case to support a lower end portion of the camera module to limit axial movement of the camera module, wherein an area of the lower end portion supported by the second projection is smaller than an entire area of the lower end portion.

6. The camera assembly of claim 5, wherein the first inner surface comprises a side wall and the second inner surface comprises a lower wall of the cylindrical camera surface.

7. The camera assembly of claim 5, wherein the lower end portion of the camera module comprises a printed circuit board.

8. The camera assembly of claim 5, wherein the second projection is disposed to provide support for an area proximate to at least one outer edge of the camera module.

* * * * *